United States Patent [19]
DiPiazza

[11] 4,102,683
[45] Jul. 25, 1978

[54] NONREFLECTING PHOTORESIST PROCESS

[75] Inventor: James John DiPiazza, Mt. Laurel, N.J.

[73] Assignee: RCA Corp., New York, N.Y.

[21] Appl. No.: 767,479

[22] Filed: Feb. 10, 1977

[51] Int. Cl.² ............................................. G03C 5/00
[52] U.S. Cl. .................... 96/38.4; 96/27 R; 96/84 R; 96/84 M; 350/164
[58] Field of Search ............... 96/27 R, 84 M, 38.3, 96/38.4, 84 A; 350/164

[56] References Cited
U.S. PATENT DOCUMENTS

| 2,902,365 | 9/1959 | Martin | 96/84 R |
| 3,958,042 | 5/1976 | Katsube et al. | 350/164 |

OTHER PUBLICATIONS

Perveev et al., Sov. J. Opt. Technol., vol. 41, #8 Aug. 1974, pp. 453–454, Rm. 4-8-32.

Primary Examiner—John D. Welsh
Attorney, Agent, or Firm—H. Christoffersen; Sanford J. Asman

[57] ABSTRACT

A light absorbing medium is interposed between a photosensitive layer, such as a photoresist layer, and the surface upon which the photosensitive layer is to be applied in order to eliminate surface effects which result from the reflection of light which passes through the photosensitive layer and is then reflected upward from the surface back into the photosensitive layer. The light absorbing medium may be either a quarter-wave plate or a filter chosen to absorb light of the energy spectrum to which the photosensitive layer is sensitive.

1 Claim, 1 Drawing Figure

U.S. Patent  July 25, 1978  4,102,683
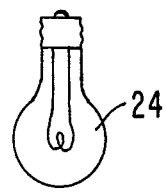
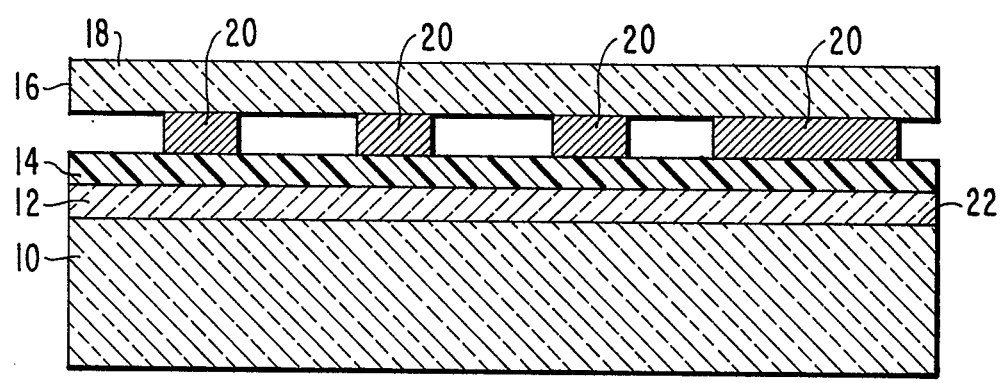

NONREFLECTING PHOTORESIST PROCESS

The present invention relates to a photolithographic process which employs photosensitive materials.

In the manufacture of semiconductor devices, photolithographic processes are employed in which materials are coated with photosensitive materials, such as photoresist. The photosensitive material is defined by exposing it to light through a photomask having an opaque pattern. The pattern configuration corresponds to a positive or negative of the pattern which is to be formed on the body. Thereafter the photosensitive material is developed to remove either the exposed or unexposed portions which overlie portions of the body.

One of the problems which exists in processes of this type is caused by the fact that some of the light striking a thin layer of a photosensitive material will usually pass through the layer and be reflected upward from the body. As the incident light is generally not perfectly normal to the surface of the photosensitive material, and as it may be diffracted upon passage through the photomask, the incident light will be reflected angularly from the surface of the body rather than normally therefrom. Such light will impinge upon the unexposed portions of the photosensitive material and some may again pass through the photosensitive material to strike the opaque portions of the photomask and this light will be reflected back into some portions of the photosensitive material which are not intended to be exposed. As a result of light being reflected back and forth between the substrate and the photomask as well as light being scattered from surface irregularities, there may be a pronounced effect upon the resolution which can be obtained in defining the photosensitive material.

In order to eliminate problems of the type described in accordance with the present invention, a light absorbing layer is interposed between the surface of the body and the photosensitive material. The light absorbing layer has the property of absorbing light which passes through the photosensitive layer and not reflecting it back upward. The layer may be comprised either of a quarter-wave plate or of a material which is fluorescent when energized by light having a wavelength suitable for exposing the photosensitive material and which gives off light having a different wavelength which is incapable of exposing the photosensitive material.

The sole FIGURE of the drawing is a cross-sectional view of the device of the present invention.

Referring to the drawing, a body 10 of a semiconductor material (which is silicon in this example) is shown. Applied to the surface 22 of the body 10 is a light absorbing layer 12. A layer of a photosensitive material 14, in this case photoresist, is applied to the surface of the antireflective layer 12. A photomask 16 having a transparent substrate 18 and opaque portions 20 applied thereto is placed on the surface of the photoresist layer 14 and is used, together with an energizing light 24, to define a pattern on the photoresist layer 14 corresponding to the pattern of the opaque portions 20 of the photomask 16.

The purpose of the light absorbing layer 12 is to eliminate reflections between the photomask 16 and the surface 22 of the body 10. The light absorbing layer 12 must therefore be capable of absorbing at least that part of the energy emitted by the light 24 to which the photoresist layer 14 is sensitive. The light absorbing layer 12 will then absorb any such wavelength light which is transmitted through the photoresist layer 14 thereby reducing or eliminating reflections of such light from the surface 22 of the body 10 and providing better line definition on the photoresist layer 14.

The light absorbing layer 12 may be comprised of either a quarter-wave plate having a thickness corresponding to one-fourth the peak wavelength of the light required to expose the photoresist layer 14, or, alternatively, the light absorbing layer 12 may be comprised of a filter capable of absorbing the energy spectrum of light to which the photoresist layer 14 is sensitive. In general, if the surface 22 is irregular, it is preferable to use a filter for the light absorbing layer 12. On the other hand, a quarter-wave plate will be effective if the surface 22 is smooth.

In the first embodiment of the present invention, the light absorbing layer 12 is an odd multiple thickness of one quarter of the peak wavelength of the light which is required to expose the photoresist layer 14, i.e. the wavelength which the photosensitive material is sensitive to. A layer 12 having an odd multiple thickness of one-quarter of the wavelength of light to which the photosensitive layer is sensitive, called $\lambda$ herein, will be called a quarter-wave plate herein. The term expressly includes all layers having a thickness of $\lambda(2N+1)/4$, where N is a non-negative integer. The destructive interference provided by the quarter-wave plate results in the prevention of light reflection from the surface 22 of the body 10 after it passes through the photoresist layer 14.

In this example, in order to make the quarter-wave plate light absorbing layer 12, a silicon dioxide layer can be thermally grown or deposited in any known manner, such as by the decomposition of silane. The time and rate of growth or decomposition are controlled so the thickness of the layer 12 will be an odd multiple of one-fourth the wavelength required to expose the photoresist layer 13. Thus, for example, if mercury vapor lamps which emit light having a principle wavelength of 3650Å, are used to expose the photosensitive layer 14, which is sensitive to light having a wavelength of 3650Å, the thickness of the light absorbing layer 12, which would be comprised of silicon dioxide, would ideally be an odd multiple of 912.5Å.

An alternative embodiment of the present invention, which can be explained with reference to the same figure, makes use of a light absorbing layer 12 comprised of a fluorescent dye which is capable of absorbing the energy emitter by the light source 24. The fluorescent dye used in the light absorbing layer 12 is selected so that it will absorb any light transmitted through the photoresist layer 14 and will give off light having a different, greater, wavelength, i.e. a reduced energy level. The fluorescent dye is selected so that the light given off by the fluorescent light absorbing layer 12 is at wavelengths incapable of exposing the photoresist layer 14.

A suitable fluorescent dye is used to manufacture the light absorbing layer 12 by mixing the dye with an organic binder, which itself may or may not absorb the energizing light. A thermosetting plastic which is compatible with the photoresist bake temperature is preferably used as the binder for the fluorescent dye. Suitable binders which may be used in the light absorbing layer 12 are Fluorel made by the 3M Company and Viton made by DuPont, and suitable dyes are organic phosphors 118-15-1, 118-15-3, 118-15-4, and 118-15-5 made by the General Electric Corporation. A suitable solution can be made by mixing 20 grams of Viton in 66 milliliters of toluene, 66 milliliters of butyl acetate, and 66 milliliters of acetone. Twenty milliliters of that solution is mixed with 10 milliliters of hexamethlydisilazane and then diluted with additional acetone containing any of the above mentioned dyes in the ratio of 1 gram of dye per 100 milliliters of acetone to obtain 100 milliliters of a solution which is spun onto the surface of the wafer 10 at about 7000 rpm. The wafer is then placed in an oven at 85° C to evaporate the solvent. Then the wafer is coated with a photoresist material, such as Waycoat Photoresist, made by Philip A. Hunt Chemical Corporation of Palisades Park, N.J. which is spun onto the surface of the wafer 10 at about 4500 rpm.

What is claimed is:

1. An improved photolithographic method for defining a pattern of a photoresist layer which overlies a material, said photoresist layer being sensitive to light of a particular peak wavelength, the method being of the type which includes the step of exposing said photosensitive layer to a pattern of light having a frequency distribution which includes said peak wavelength, wherein the improvement comprises:

applying a light absorbing layer comprising a fluorescent dye selected to absorb light of said particular peak wavelength and to emit light of a different wavelength which said photoresist layer is not sensitive to between said material and said photoresist layer prior to said step of exposing whereby light of said particular peak wavelength which passes through said photoresist layer during said step of exposing will be absorbed by said light absorbing layer and not reflected back into said photoresist layer.

* * * * *